INVENTOR
ANDRE E. VIOLET
BY R. P. Morris
ATTORNEY

INVENTOR
ANDRE E. VIOLET
BY R.P. Morris
ATTORNEY

Patented Nov. 14, 1950

2,529,980

UNITED STATES PATENT OFFICE 2,529,980

INDICATING TUNING DEVICE, PARTICULARLY FOR FREQUENCY-MODULATION RECEIVERS

André Violet, Boulogne-Billancourt, France

Application June 23, 1949, Serial No. 100,922
In France April 30, 1948

7 Claims. (Cl. 250—40)

The present invention relates to tuning indicating devices and particularly to those for frequency modulation receivers.

An accurate tuning of modulation frequency receivers is more difficult than that of amplitude modulation receivers. It seldom happens that the discriminator circuit which changes the frequency modulated wave into an amplitude modulated wave has a sufficiently wide band width to tolerate considerable tuning errors. These tuning errors lead to considerable distortions which in fact more than counterbalance the advantageous features of frequency modulation.

The operator may appreciate the degree of tuning by ear, but this is quite insufficient in practice since there are usually two zones of apparent tuning on both sides of the actual correct tuning. It is also possible to control the operation of a visual indicator by means of the D. C. potential appearing in the grid circuit of one of the amplitude limiter stages normally provided in the receiver. The maximum of the D. C. potential thus detected extends over a wide band and it is not possible to arrive at a correct tuning by this method. On the other hand, it is more important to effect the tuning on the discriminator rather than on the amplitude limiter, since these two tunings do not always coincide one with the other, in practice.

It is known to use for this purpose a microammeter, the pointer of which moves from one side to the other of a zero central position. This microammeter can be arranged in series with the detection resistance of the discriminator. When the operator approaches the correct tuning, the pointer, which is deflected in one direction, goes over to zero for the correct tuning, and then deflects in the other direction when the tuning has been passed over. This arrangement is costly and cumbersome.

It is also known to use a visual tuning indicator, directly controlled by the output D. C. component of the discriminator. With this arrangement it is difficult to appreciate the position of the visual indicator corresponding to a null potential, i. e. to the correct tuning since there is no reference mark.

One object of the present invention is a tuning indicator device for a frequency modulation receiver with which it is possible to tune the receiver correctly on the carrier current of the transmitter.

According to features of the present invention, the balanced discriminator can be the discriminator used for the normal operation of the receiver, use being made of the D. C. control potential which appears across the terminals of the discriminator when it is not tuned on the mean signal frequency.

According to other features of the invention the signal is amplitude modulated at a low frequency during the tuning so as to operate an electronic indicator when the tuning is not correct.

According to other features of the invention the tuning can be made by means of an audible device.

The above-mentioned and other features and objects of this invention, and the manner of attaining them will become more apparent and the invention itself will be best understood by reference to the following description of an embodiment of the invention, taken in conjunction with the accompanying drawings, wherein—

Figure 1:
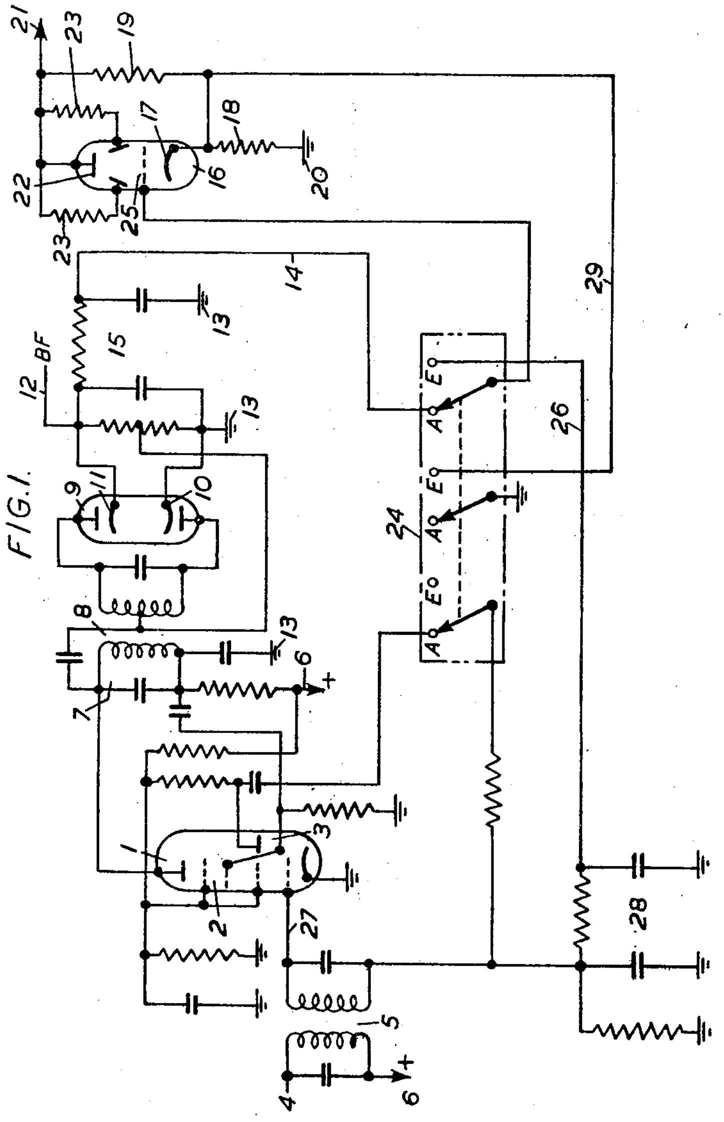
Fig. 1 is a schematic view of an embodiment of an indicator according to the invention.

Reference numeral 1 represents a triode hexode vacuum tube whose hexode section 2 functions as an amplitude limiter and the triode elements work with the hexode as a very low frequency multi-vibrator at a few cycles per second. The intermediate frequency signal is applied at the input 4 of the intermediate frequency transformer 5 connected at 6 to a high potential battery. The secondary of the intermediate frequency transformer is connected to the grid of the hexode section 2 of vacuum tube 1 of the amplitude limiter. The plate of the hexode section 2 of the vacuum tube is connected to the input 7 of the discriminator transformer 8; said discriminator comprises a double diode vacuum tube 9, for example. The potential from the discriminator is picked up between cathodes 10 and 11 of the double diode 9 and then transmitted to the low frequency part of the receiver by lead 12 and the ground 13 and to the tuning device by lead 14 through a filter 15.

The tuning device comprises an electronic indicator 16 supplied by an appropriate source of potential supplied at 21. The cathode 17 of this indicator is biassed by a potential supplied by resistances 18 and 19 in series connection between the ground 20 and the high potential supplied at 21. The plate 22 of the electronic indicator 16 is brought to the high potential applied at 21 and the deflecting electrodes are brought to an appropriate potential through the high resistance 23. By means of a double-throw three pole switch 24, it is possible to switch the electronic indicator into two positions E and A. Position E corresponds to the normal operation of the receiver, and position A is the position in which the tuning of the receiver is made and during which this receiver is put out of action.

In position E lead 26 applies to the grid 25 of the electronic indicator 16 a potential detected by grid 27 of vacuum tube 1 of the limiter stage through the filtering circuit 28, and resistance 18 is short-circuited by wire 29 connecting the cathode of vacuum tube 16 to the ground. In this way it is possible to obtain an approximate tuning of the receiver while still listening, by the used of the D. C. potential detected in the grid circuit of the amplitude limiter stage which reached its maximum value at the tuning point.

In position A, the multi-vibrator applies to the limiter grid the low frequency which modulates the incoming signal through the left contact of the switch, resistance 18 is connected by the central blade of the switch, and the cathode of the electronic indicator is biassed by the potential provided by the potential divider comprising resistances 18 and 19. The low frequency from the discriminator is applied to grid 25 by lead 14 and the right hand blade of the switch. The filtering circuit 15 has a time constant in relation with the frequency of the discriminator.

Figure 2:
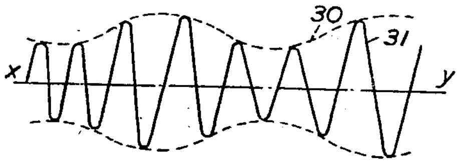
Figs. 2 and 3 are diagrams useful for the explanation of the operation of the indicator.
Figure 3:
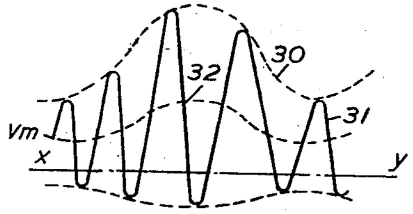

Figs. 2 and 3 are diagrams useful for the understanding of the invention.

Along the time axis $xy$ are shown the amplitude fluctuations of the signal in 30, and in 31 the fluctuations of the modulating frequency. If the average frequency of the signal coincides with the tuning frequency of the discriminator, no D. C. component is present in the output of the discriminator as shown in Fig. 2. If, on the contrary, the average signal frequency does not coincide with the tuning frequency of the discriminator, a D. C. component 32 appears at the terminals of the discriminator. To make use of the D. C. component, the signal is amplitude modulated at the input of the limiter by a very low frequency supplied by the multi-vibrator comprising triode section 3 and hexode sections 2 of vacuum tube 1 which is shown by curve 30 in Figs. 2 and 3. The electronic tuning indicator 16 receives the potential from the discriminator through the low pass filter 15 which passes the D. C. component 32 of this very low frequency and eliminates substantially all the audible modulation frequencies. The tuning indicator swings when the discriminator is not properly tuned and remains steady when the tuning is correct.

This method is very sensitive and accurate and makes it possible to effect a very accurate tuning of the receiver.

When listening in, it is sometimes noticed that the tuning point corresponds to a minimum, differing from 0, of the very low frequencies superimposed by reason of the amplitude modulation frequency, although this amplitude should theoretically be null. This small residual modulation is due to the presence of beats and transmodulation effects.

When the tuning has been effected, the operator goes back to the normal listening position and can check roughly on the tuning indicator the variations of the tuning of the receiver, by the use of the potential detected in the grid circuit of the amplitude limiter. If it appears necessary he goes back to position A in order to correct the tuning.

It is to be noted that no additional vacuum tube is necessary, since it has sufficed to replace the usual pentode of the amplitude limiter of a normal receiver by a triode hexode vacuum tube as explained above. The operation of the limiter stage is in no way impaired.

Figure 4:
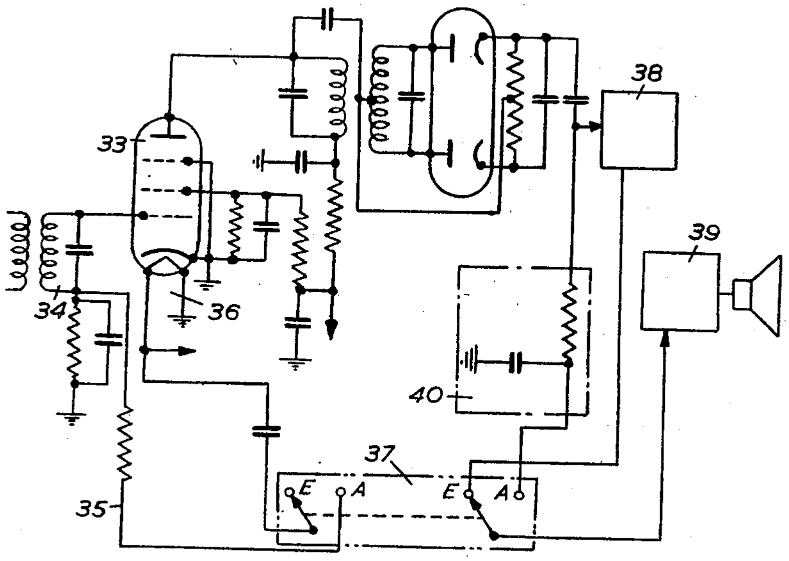
Fig. 4 shows schematically another embodiment.

Fig. 4 shows a variant of the circuit of Fig. 1. The elements already appearing in Fig. 1 have been designated by the same reference numerals. In this arrangement the limiter stage comprises a pentode 33 connected in a manner similar to vacuum tube 1 of Fig. 1. The amplitude modulation super-imposed on the incoming signal is effected by the application of an A. C. potential at the frequency of the mains through the secondary winding 34 of the intermediate frequency stage by means of lead 35 connected to the heater circuit 36 of vacuum tube 33 through a switch 37. The potential from the discriminator is applied to the low frequency gain control circuit 38 which is a normal element of the receiver set and can be directly applied to the low frequency stage 39 of the receiver through a low-pass filter 40 by means of switch 37. In the normal listening position E the amplitude modulator does not work and the low frequency gain control circuit 38 is connected to the low frequency amplifier circuit 39, in tuning position the amplitude modulator is operated and the amplification circuit 39 directly connected to the low frequency filter 40. The tuning is made by adjusting the mains humming to a minimum. The purpose of low pass filter 40 is to eliminate the frequency modulation of the signal. By means of this device it is possible to arrive at a sufficiently accurate tuning without any additional vacuum tube.

While I have described above the principles of my invention in connection with specific apparatus, it is to be clearly understood that this description is made only by way of example and not as a limitation to the scope of my invention.

What is claimed is:

1. In combination with a receiver for frequency modulated waves provided with a balanced tunable frequency discriminator, a local source of low frequency waves, means for amplitude modulating the waves received by said receiver with said low frequency waves, means for applying said modulated waves through said discriminator, and an indicator responsive to the amplitude of the low frequency modulated direct current component in the output of said discriminator for indicating the tuning of said discriminator.

2. An arrangement according to claim 1, wherein said receiver comprises an amplitude limiter stage, and means for applying said modulated waves through said limiter stage to said discriminator.

3. An arrangement according to claim 2, wherein said source of low frequency wave comprises an electron discharge device selectively coupled to said limiter stage for producing said low frequency waves and for mixing said waves with the received waves applied to the limiter.

4. An arrangement according to claim 3, wherein said limiter stage comprises an electron discharge device, said limiter stage and first mentioned device comprising a multi-vibrator circuit.

5. An arrangement according to claim 4, wherein said limiter stage comprises a hexode electron discharge device, and said first mentioned device comprises a triode.

6. An arrangement according to claim 1, further comprising a low pass filter for coupling the output of the discriminator to said indicator, said filter passing said modulated direct current component while substantially eliminating the modulating frequencies of the frequency modulated waves received.

7. An arrangement according to claim 1, further comprising a power supply for said receiver, said power supply comprising alternating current waves, and said local source of low frequency waves comprising means for obtaining a portion of the output of said power source.

ANDRÉ VIOLET.

REFERENCES CITED

The following references are of record in the file of this patent:

UNITED STATES PATENTS

| Number | Name | Date |
|---|---|---|
| 2,280,607 | Roberts | Apr. 21, 1942 |
| 2,334,473 | Carlson | Nov. 16, 1943 |
| 2,379,765 | Trevor | July 3, 1945 |